(12) United States Patent
Sung et al.

(10) Patent No.: US 12,733,178 B2
(45) Date of Patent: Sep. 8, 2026

(54) SCALED ONE TRANSISTOR TWO RESISTOR (1T 2R) MEMORY

(71) Applicant: International Business Machines Corporation, Armonk, NY (US)

(72) Inventors: Min Gyu Sung, Latham, NY (US); Ruilong Xie, Niskayuna, NY (US); Julien Frougier, Albany, NY (US); Chanro Park, Clifton Park, NY (US); Juntao Li, Cohoes, NY (US); Soon-Cheon Seo, Glenmont, NY (US)

(73) Assignee: International Business Machines Corporation, Armonk, NY (US)

(*) Notice: Subject to any disclaimer, the term of this patent is extended or adjusted under 35 U.S.C. 154(b) by 136 days.

(21) Appl. No.: 18/621,095

(22) Filed: Mar. 29, 2024

(65) Prior Publication Data

US 2025/0311240 A1 Oct. 2, 2025

(51) Int. Cl.
*H10B 63/00* (2023.01)
*G11C 11/16* (2006.01)
(Continued)

(52) U.S. Cl.
CPC .......... *H10B 63/82* (2023.02); *G11C 11/1659* (2013.01); *G11C 11/1675* (2013.01);
(Continued)

(58) Field of Classification Search
CPC ........ H10B 63/82; H10B 61/10; H10B 61/22; H10B 63/24; H10B 63/30; H10B 63/20;
(Continued)

(56) References Cited

U.S. PATENT DOCUMENTS 8,059,449 B2 11/2011 Shih
11,430,513 B1 8/2022 Seo
(Continued)

FOREIGN PATENT DOCUMENTS

CN 114242748 A 3/2022
CN 114783486 B 8/2022
(Continued)

OTHER PUBLICATIONS

Abinaya S., Gayathri J, Giridharan S, Swaminathan, M. (2018). Nonvolatile field-programmable gate array with high-reliability and high intensity using 1D2R RRAM array. International Journal of Advance Research and Development.
(Continued)

*Primary Examiner* — Jerome Leboeuf
(74) *Attorney, Agent, or Firm* — Harrity & Harrity, LLP

(57) ABSTRACT

A semiconductor structure includes a selection transistor having a first drain-source terminal, a second drain-source terminal, at least one channel region between the first and second source-drain terminals, and a gate adjacent the at least one channel region. A first vertical contact structure is connected to the first drain-source terminal. A second vertical contact structure is connected to the second drain-source terminal. A first resistive memory cell has a lower electrode coupled to the second vertical contact structure and has an upper electrode. A third vertical contact structure is connected to the upper electrode of the first resistive memory cell. A second resistive memory cell has an upper electrode coupled to the second vertical contact structure and has a lower electrode. A fourth vertical contact structure is connected to the lower electrode of the second resistive memory cell.

20 Claims, 16 Drawing Sheets

(51) Int. Cl.
*G11C 13/00* (2006.01)
*H10B 61/00* (2023.01)

(52) U.S. Cl.
CPC ........ *G11C 13/003* (2013.01); *G11C 13/0069* (2013.01); *H10B 61/10* (2023.02); *H10B 61/22* (2023.02); *H10B 63/24* (2023.02); *H10B 63/30* (2023.02); *G11C 2213/79* (2013.01)

(58) Field of Classification Search
CPC . H10B 63/80; G11C 11/1659; G11C 11/1675; G11C 13/003; G11C 13/0069; G11C 2213/79; H10N 70/20; H10N 70/826
See application file for complete search history.

(56) References Cited

U.S. PATENT DOCUMENTS

| | | | | |
|---|---|---|---|---|
| 2006/0275962 | A1* | 12/2006 | Lee | H10D 84/038 257/E27.005 |
| 2021/0134339 | A1* | 5/2021 | Song | H10N 50/85 |
| 2021/0159272 | A1* | 5/2021 | Cho | H10N 50/80 |
| 2022/0122660 | A1 | 4/2022 | Nissan-Cohen | |
| 2023/0263079 | A1* | 8/2023 | Yang | H10N 70/883 257/4 |

FOREIGN PATENT DOCUMENTS

| | | |
|---|---|---|
| EP | 1630817 B1 | 11/2008 |
| JP | 6242934 B2 | 12/2017 |

OTHER PUBLICATIONS

Roldán, J. B., Miranda, E., Maldonado, D., Mikhaylov, A. N., Agudov, N. V., Dubkov, A. A., . . . & Chua, L. O. (2023). Variability in resistive memories. Advanced Intelligent Systems, 2200338.
Tosson, A. M., Yu, S., Anis, M. H., & Wei, L. (Oct. 2017). 1T2R: A novel memory cell design to resolve single-event upset in RRAM arrays. In 2017 IEEE 12th International Conference on ASIC (ASICON) (pp. 12-15). IEEE.
Jinshan Yue. AERIS: area/energy-efficient 1T2R ReRAM based processing-in-memory neural network system-on-a-chip. ASPDAC '19: Proceedings of the 24th Asia and South Pacific Design Automation Conference. pp. 146-151 https://doi.org/10.1145/3287624.3287635.
N. Gong. Deep learning acceleration in 14nm CMOS compatible ReRAM array: device, material and algorithm co-optimization. 2022 International Electron Devices Meeting (IEDM).
Yuting Wu. Demonstration of a Multi-Level μA-Range Bulk Switching ReRAM and its Application for Keyword Spotting. 2022 IEEE International Electron Devices Meeting (IEDM).
Peter Mell and Timothy Grance, The NIST Definition of Cloud Computing, NIST Special Publication 800-145, Sep. 2011, cover, pp. i-iii and 1-3.
Materials-enable patterning helps eliminate trade-offs in PPAC. Mar. 24, 2024. pp. 12.

* cited by examiner 1013
1019
1021
1017
1015
1011B
1009
1008
1003
1007
1005
1001

1013
1021
1017
1019
1015
1011A
1009
1008
1003
1007
1005
1001

1013
1023
1019
1021
1017A
1023
1015
1011B
1009
1008
1007
1005
1003
1001

1013
1019
1021
1017A
1015
1011B
1009
1008
1007
1005
1003
1001

1013
1021
1017A
1023
1015A
1019
1025
1011C
1009
1008
1007
1003
1005
1001

1013
1021
1017A
1023
1015
1019
1011C
1009
1008
1007
1003
1005
1001

SCALED ONE TRANSISTOR TWO RESISTOR (1T 2R) MEMORY

BACKGROUND

The present invention relates generally to the electrical, electronic and computer arts and, more particularly, to integrated circuits including memory circuits.

Continued progress in the field of microelectronics (e.g., in memory circuits) seeks increased scaling. A current four transistor-four resistor (4T 4R) memory cell configuration includes an array of four one transistor-one resistor unit cells. There are limits to how small this cell configuration can be scaled. The memory cells can include, for example, ReRAM (resistive random access memory); PCRAM (Phase-change memory), FERAM (Ferroelectric RAM), and MRAM (Magnetoresistive random-access memory).

BRIEF SUMMARY

Principles of the invention provide techniques for a scaled one transistor two resistor (1T 2R) memory. In one aspect, an exemplary semiconductor structure includes a selection transistor having a first drain-source terminal, a second drain-source terminal, at least one channel region between the first and second source-drain terminals, and a gate adjacent the at least one channel region; a first vertical contact structure connected to the first drain-source terminal; a second vertical contact structure connected to the second drain-source terminal; a first resistive memory cell having a lower electrode coupled to the second vertical contact structure and having an upper electrode; a third vertical contact structure connected to the upper electrode of the first resistive memory cell; a second resistive memory cell having an upper electrode coupled to the second vertical contact structure and having a lower electrode; and a fourth vertical contact structure connected to the lower electrode of the second resistive memory cell.

In another aspect, an exemplary method of forming a semiconductor structure includes providing a starting structure including: a substrate, a field effect transistor, formed on the substrate, and having a source and a drain with a gate in between, a source via, a drain via, and an inter-layer dielectric (ILD) outward of the substrate and surrounding the field effect transistor, the source via, and the drain via. Further steps include forming first and second memory cell precursors on an outer surface of the ILD, the memory cell precursors including bottom electrodes, top electrodes, memory switching material intermediate the top and bottom electrodes, and left and right side liners on the electrodes; removing only one of a left and right side liner from the top electrodes; and removing only another one of a left and right side liner from the bottom electrodes. Even further steps include forming a first metal contact on the source via, a second metal contact on the top electrode of the first memory cell precursor, a third metal contact on the bottom electrode of the second memory cell precursor, and a fourth metal contact in a region interconnecting the bottom electrode of the first memory cell precursor, the top electrode of the second memory cell precursor, and the drain via; and forming vertical metal lines on the first metal contact, the second metal contact, and the third metal contact.

In still another aspect, an exemplary method of operating a semiconductor structure includes providing the semiconductor structure, the semiconductor structure comprising: a selection transistor having a source, a drain, at least one channel region between the source and the drain, and a gate adjacent the at least one channel region; a first vertical contact structure connected to the source; a second vertical contact structure connected to the drain; a first resistive memory cell having a lower electrode coupled to the second vertical contact structure and having an upper electrode; a third vertical contact structure connected to the upper electrode of the first resistive memory cell; a second resistive memory cell having an upper electrode coupled to the second vertical contact structure and having a lower electrode; and a fourth vertical contact structure connected to the lower electrode of the second resistive memory cell. Further steps include applying a source voltage to the source of the selection transistor; applying the source voltage to one of the third and fourth vertical contact structures; and applying one of a sensing and a programming voltage at another one of the third and fourth vertical contact structures.

As used herein, “facilitating” an action includes performing the action, making the action easier, helping to carry the action out, or causing the action to be performed. Thus, by way of example and not limitation, instructions executing on one processor might facilitate an action carried out by instructions executing on a remote processor and/or an action carried out by semiconductor fabrication equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide continued progress in the field of microelectronics (e.g., in memory circuits) by providing continued scaling for microelectronic memory arrays.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a scaled one transistor two resistor (1T 2R) memory cell (or a scaled two transistor four resistor (2T 4R) memory cell) and techniques for fabricating same. In one or more embodiments, multiple memory cells are connected longitudinally with a common metal connection in the middle. There are two independent current paths with a shared selection transistor, such that with a one transistor-two resistor based mode, memory cell size can be scaled effectively. Advantageously, one or more embodiments can be extended to a vertically stacked memory cell.

Figure 2:
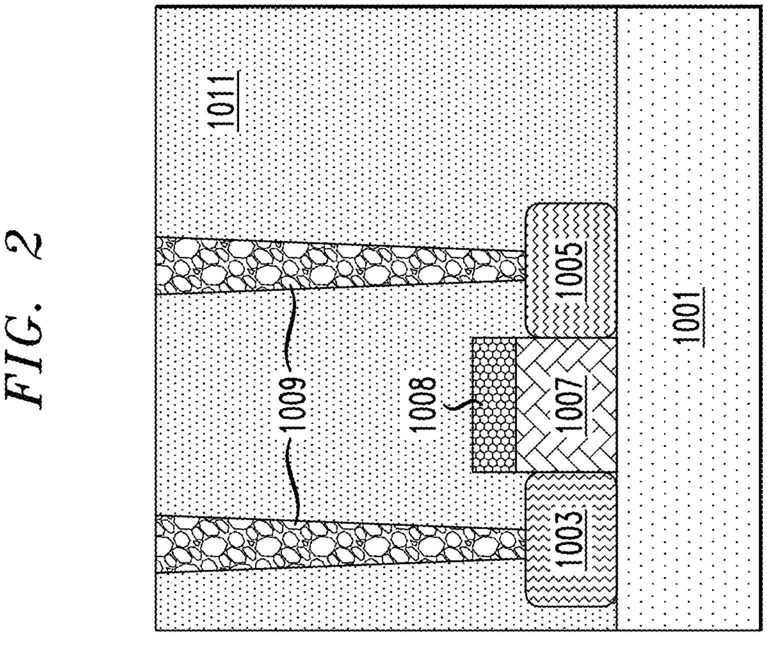

In one or more embodiments, an exemplary method begins with conventional transistor formation. FIG. 2 shows a starting point including a substrate 1001, field effect transistor with source 1003 and drain 1005 with a gate (including gate stack 1007 and a hardmask 1008 such as SIN or the like) in between (for example, surrounding one or more channel regions, not shown). Metal contacts 1009 are provided to the source and drain. Note the inter-layer dielectric (ILD) (e.g., $SiO_2$) 1011. The skilled artisan will be familiar with conventional techniques that can be adapted to form the starting structure.

Figure 3:
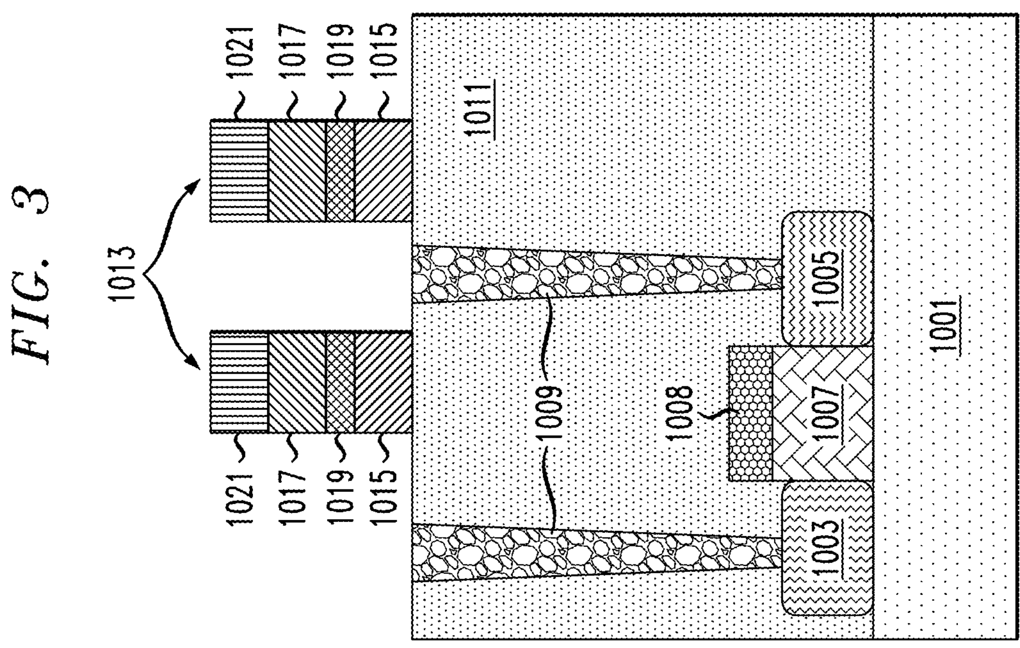
FIGS. 2-16 show exemplary process steps, according to another aspect of the invention.

In FIG. 3, pattern for memory cells. Note the memory stacks 1013 including bottom electrode 1015, top electrode 1017, memory switching material 1019, and hard mask 1021. The skilled artisan will be familiar with conventional techniques, such as lithography and etching, that can be adapted to carry out the patterning.

Figure 4:
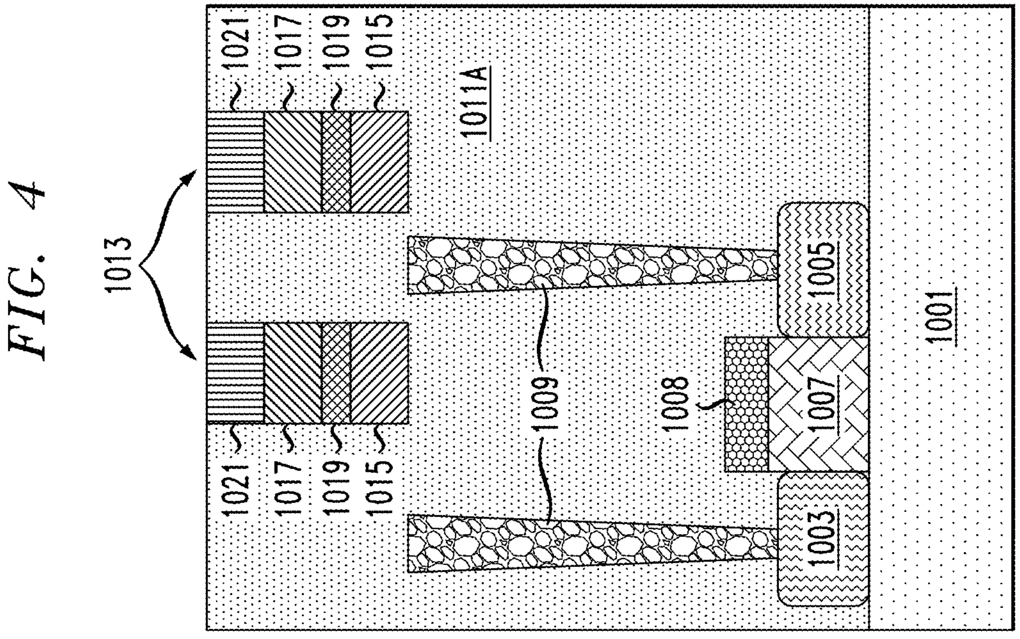

In FIG. 4, isolate the memory cells with additional inter-layer dielectric (ILD) (e.g., $SiO_2$); the ILD is now designated as 1011A.

Figure 5:
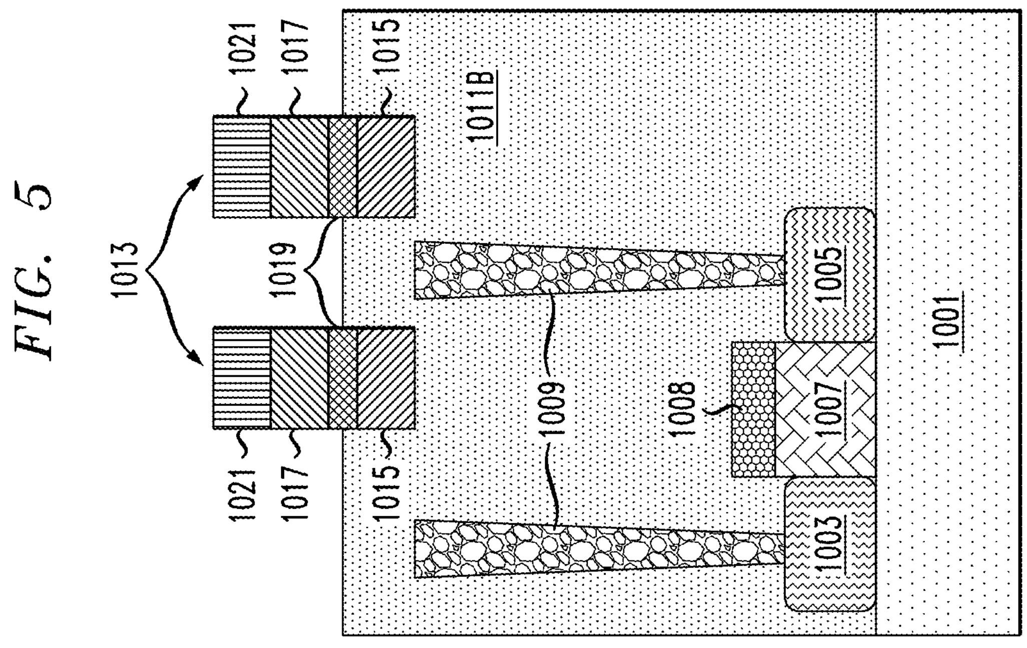

In FIG. 5, recess the inter-layer dielectric (ILD) (e.g., $SiO_2$); the ILD is now designated as 1011B.

Figure 6:
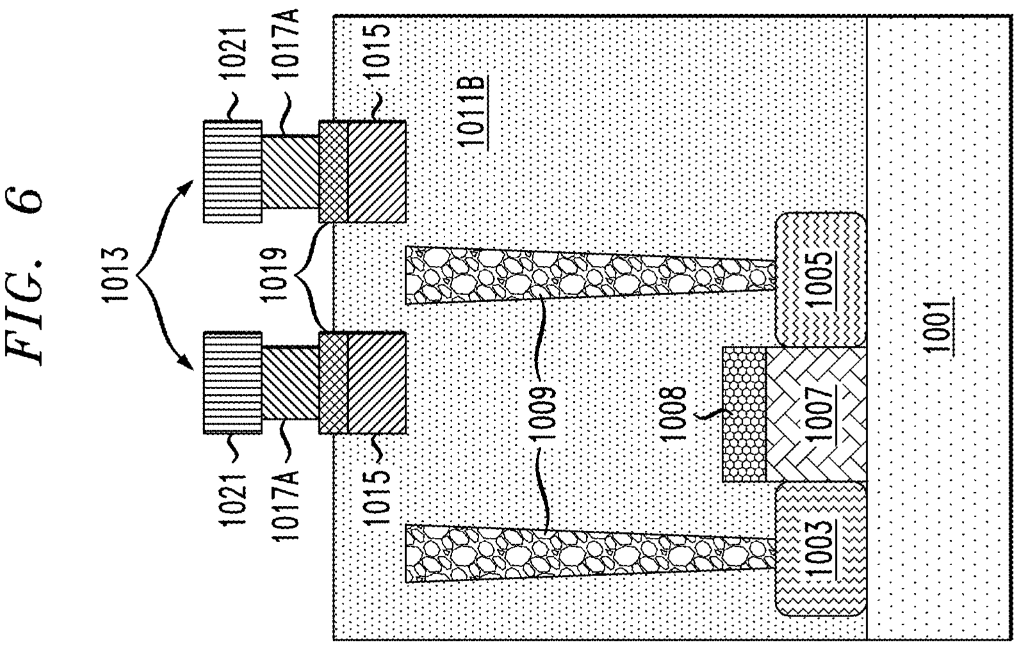

In FIG. 6, indent the top electrode using suitable selective etching. The top electrode after etching is designated as 1017A.

Figure 7:
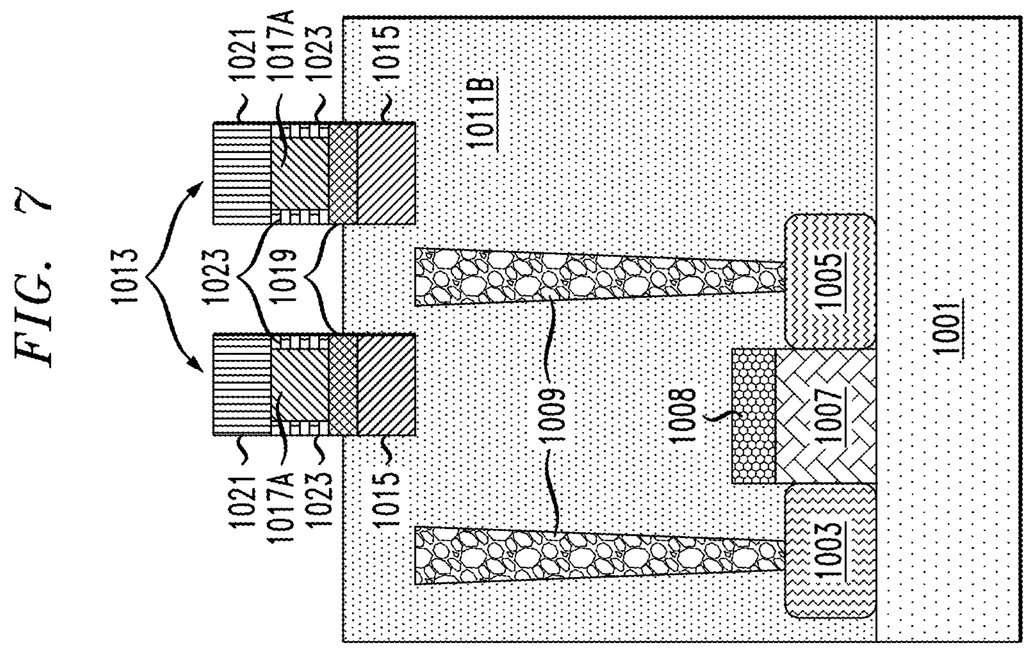

In FIG. 7, fill with a suitable liner 1023 such as SiN and etch same back so that it fills in the regions where the top electrode was indented.

Figure 8:
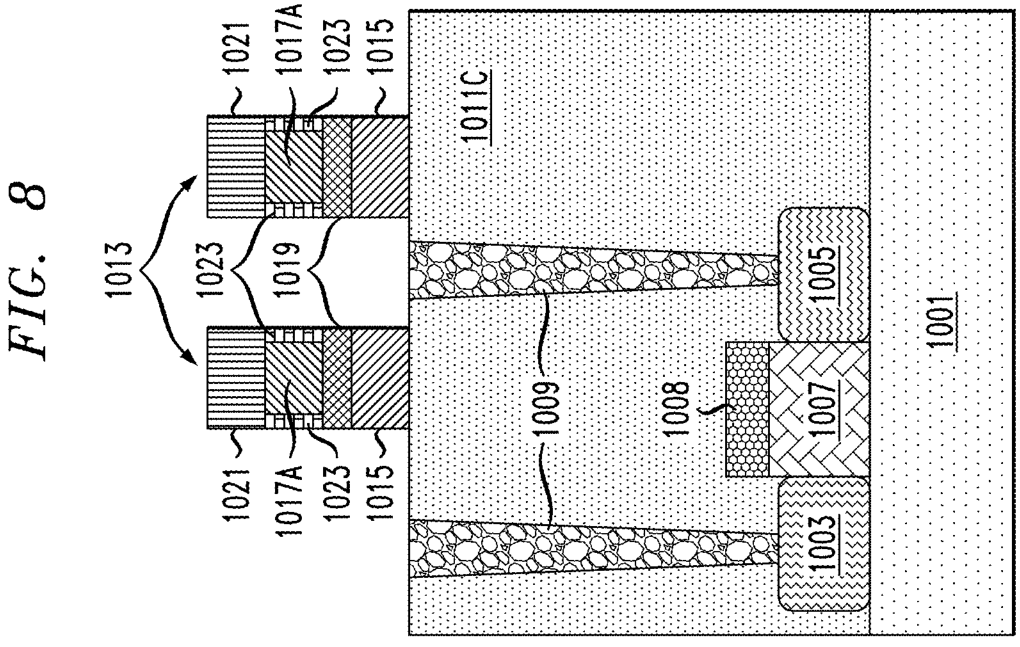

In FIG. 8, further recess the inter-layer dielectric (ILD) (e.g., $SiO_2$); the ILD is now designated as 1011C.

Figure 9:
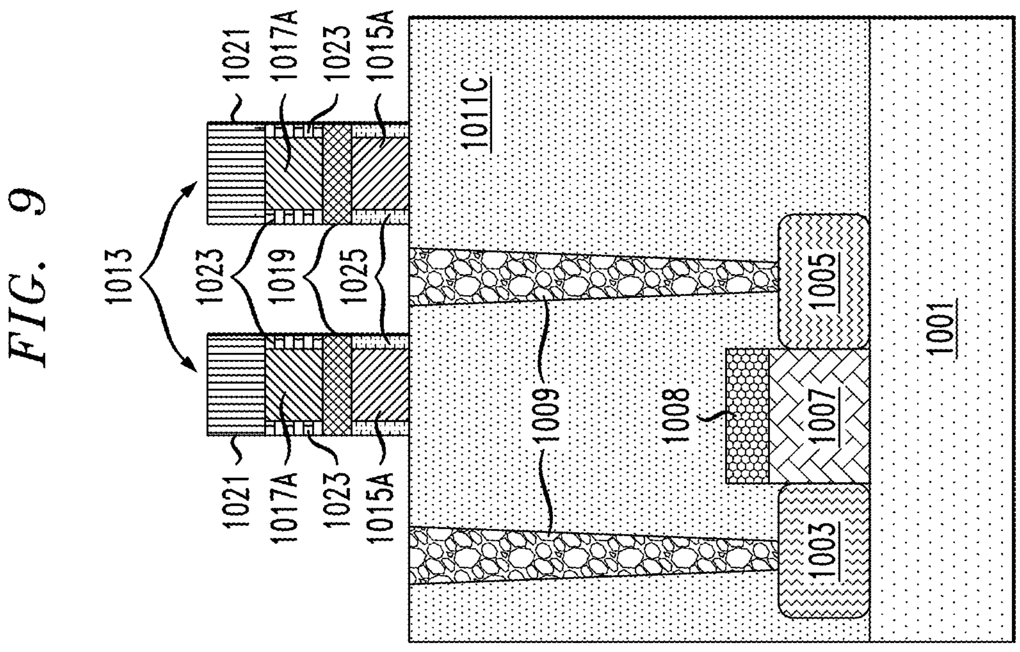

In FIG. 9, indent the bottom electrode using suitable selective etching. The bottom electrode after etching is designated as 1015A. Fill with a suitable liner 1025 such as SiCO or SiBN and etch same back so that it fills in the regions where the bottom electrode was indented.

Figure 10:
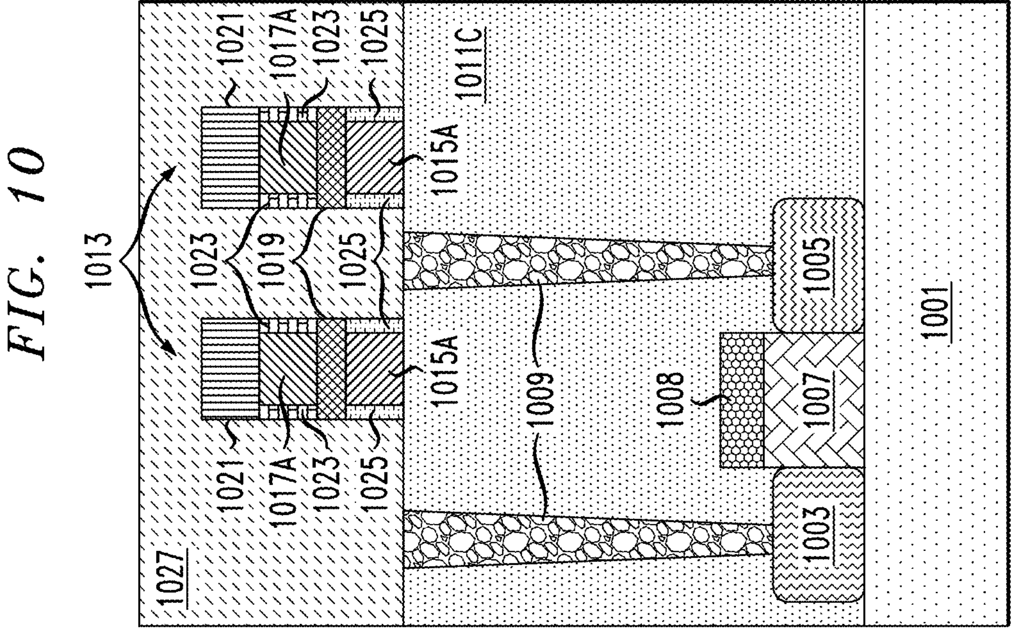

In FIG. 10, coat with an organic planarization layer (OPL) 1027.

Figure 11:
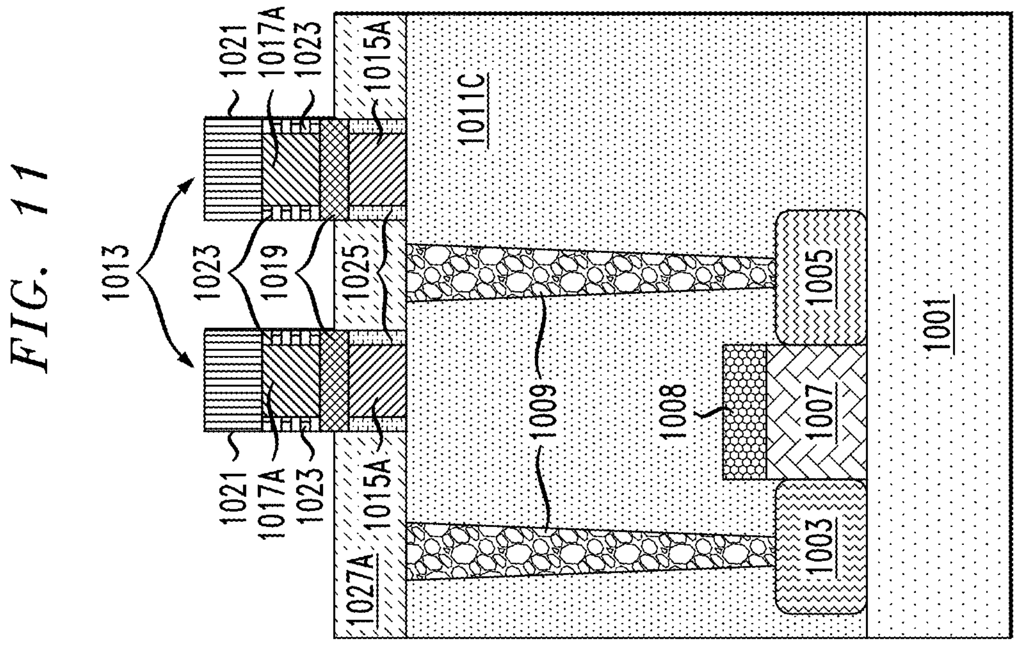

In FIG. 11, recess the organic planarization layer (OPL) which is now designated as 1027A.

Figure 12:
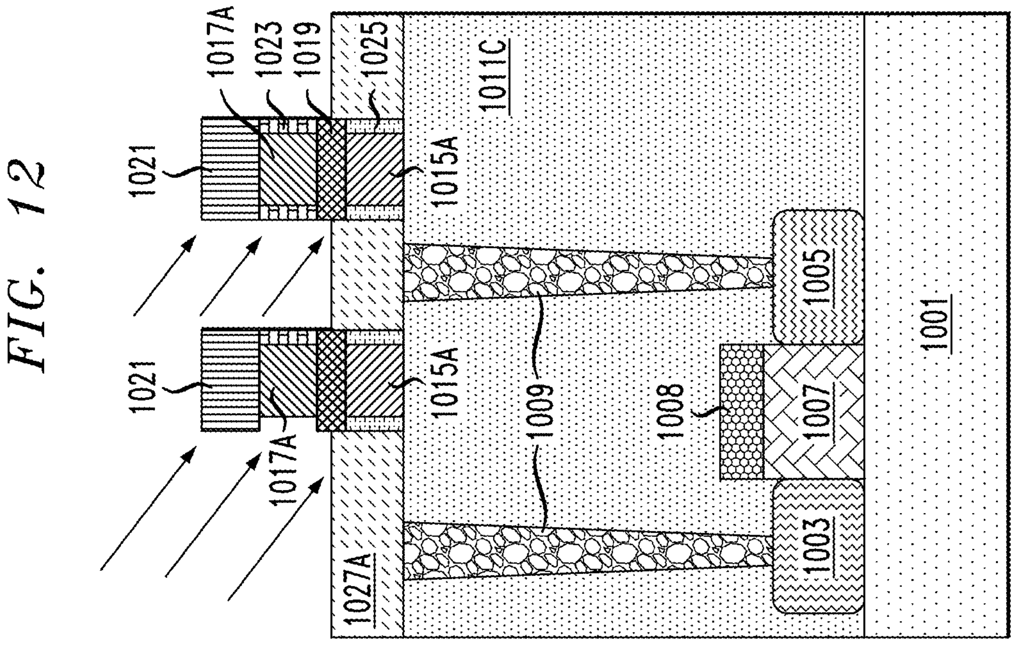

In FIG. 12, carry out angled RIE (symbolized by the angled arrows) to remove the left side liners 1023.

Figure 13:
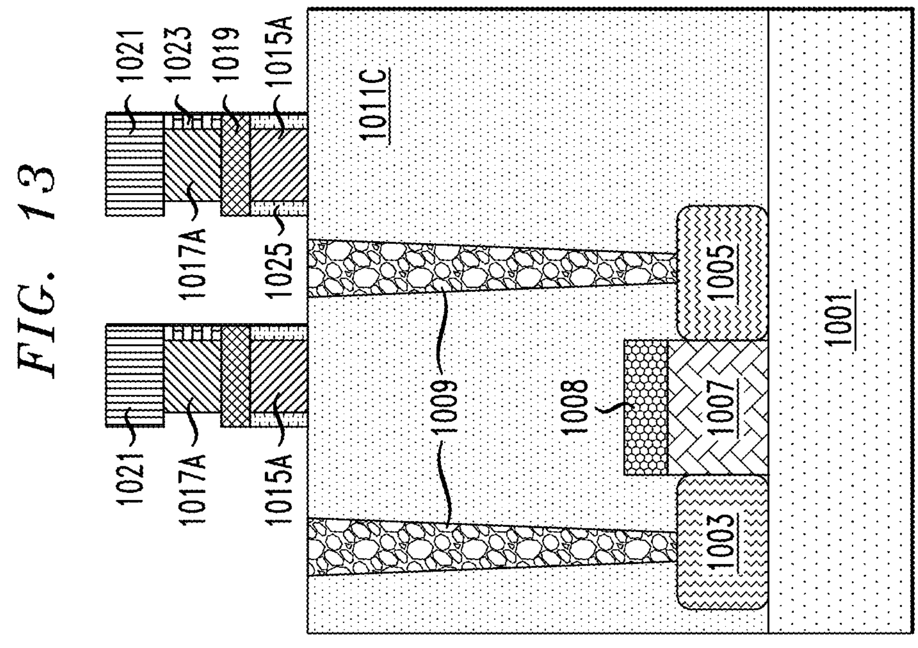

In FIG. 13, further recess (remove) the remaining organic planarization layer (OPL).

Figure 14:
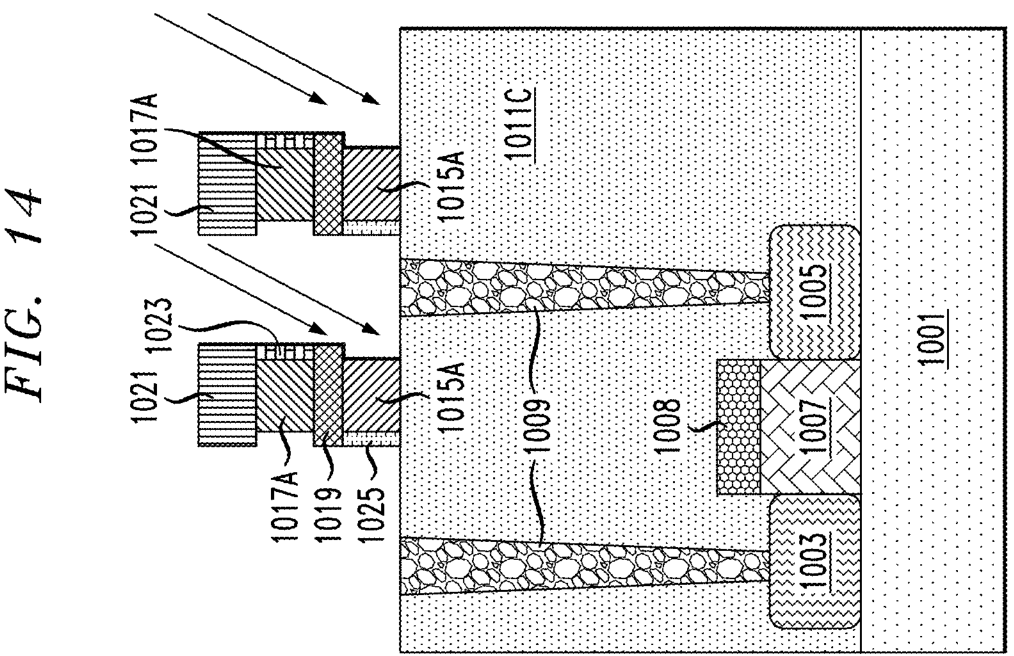

In FIG. 14, carry out angled RIE (symbolized by the angled arrows) to remove the right side liners 1025. This RIE is selective to the SiN liner, for example. Directional or lateral etching can also be used in lieu of angled RIE in FIGS. 12 and 14.

Figure 15:
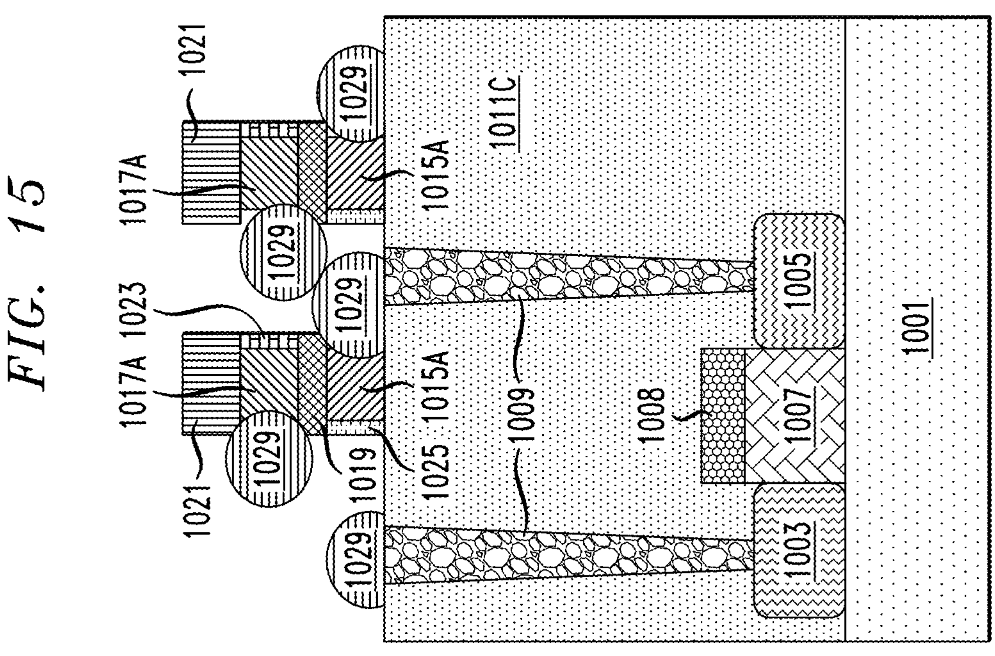

In FIG. 15, selectively deposit metal to provide contacts 1029 to elements 1015A, 1017A, and 1009 as shown.

Figure 16:
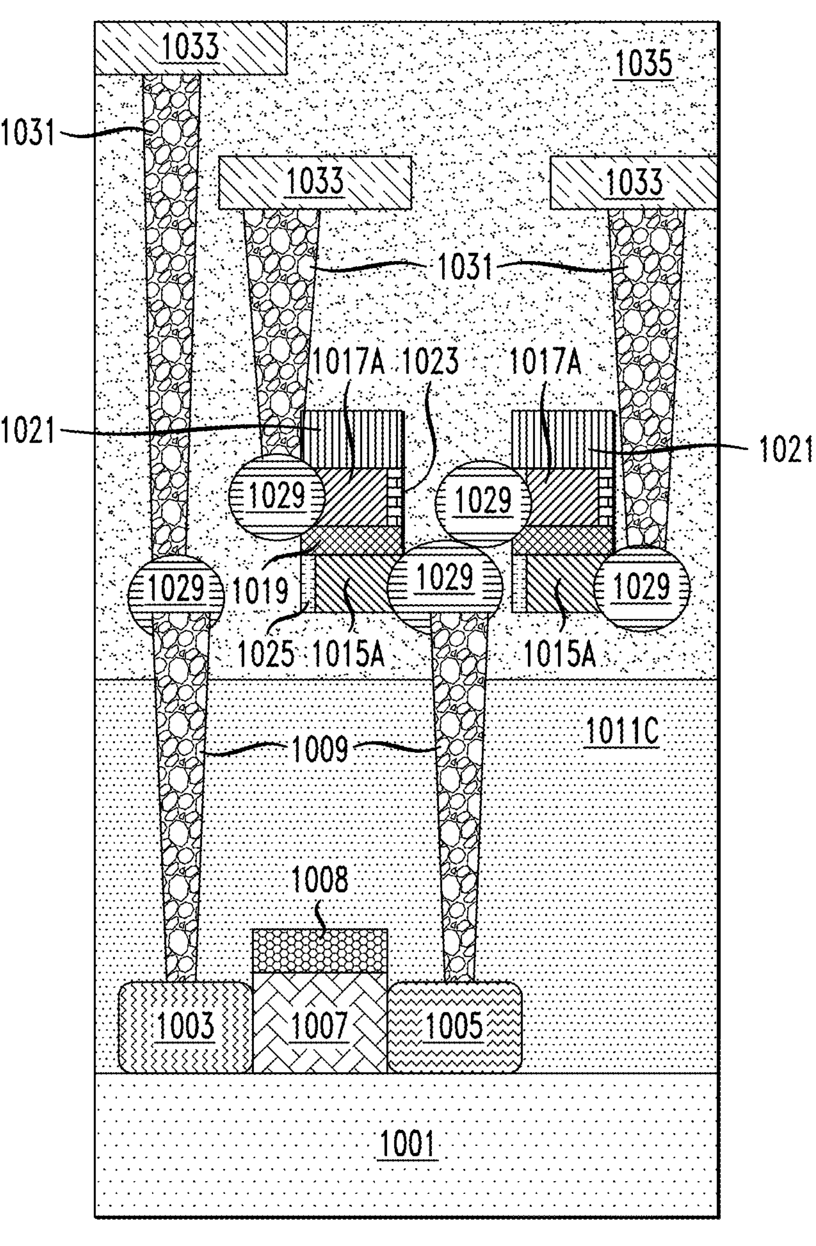

In FIG. 16, provide metal connections to contacts 1029 using vias 1031 and horizontal wiring layers 1033. Note also the additional dielectric material 1035, which can be the same as, or different than, ILD 1011C.

Figure 18:
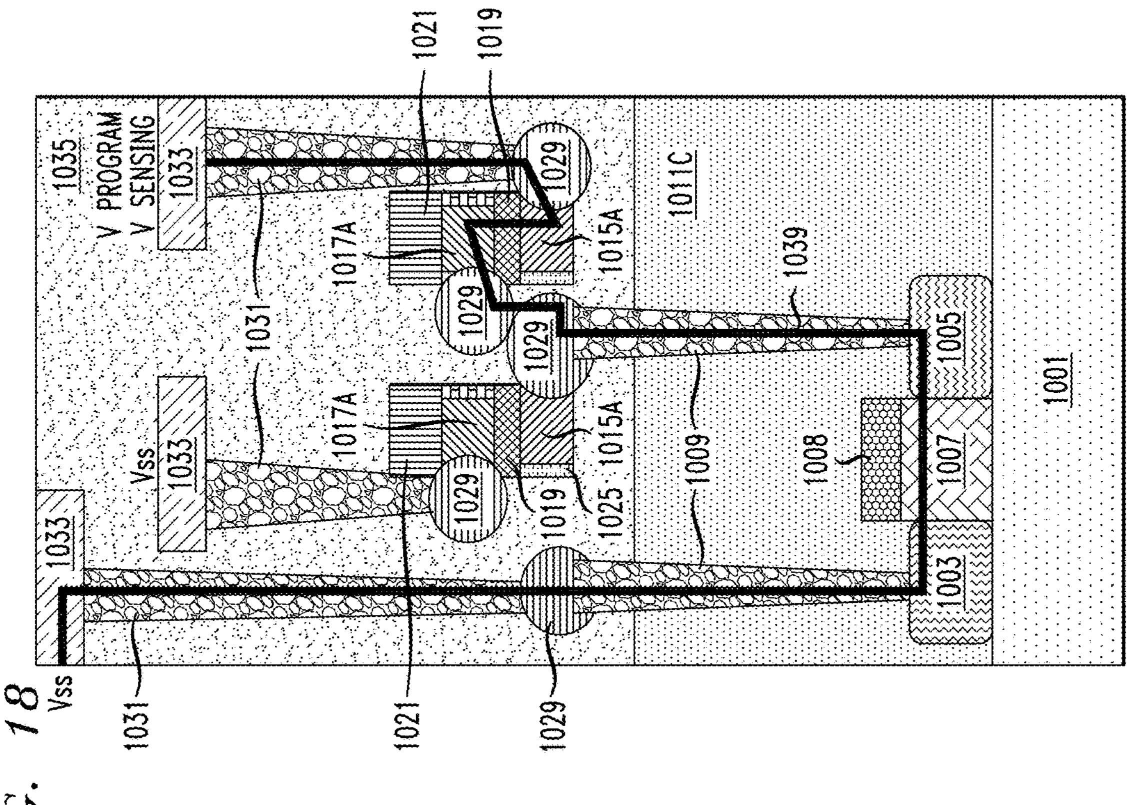
FIGS. 17 and 18 show exemplary operation modes, according to still another aspect of the invention.
Figure 17:
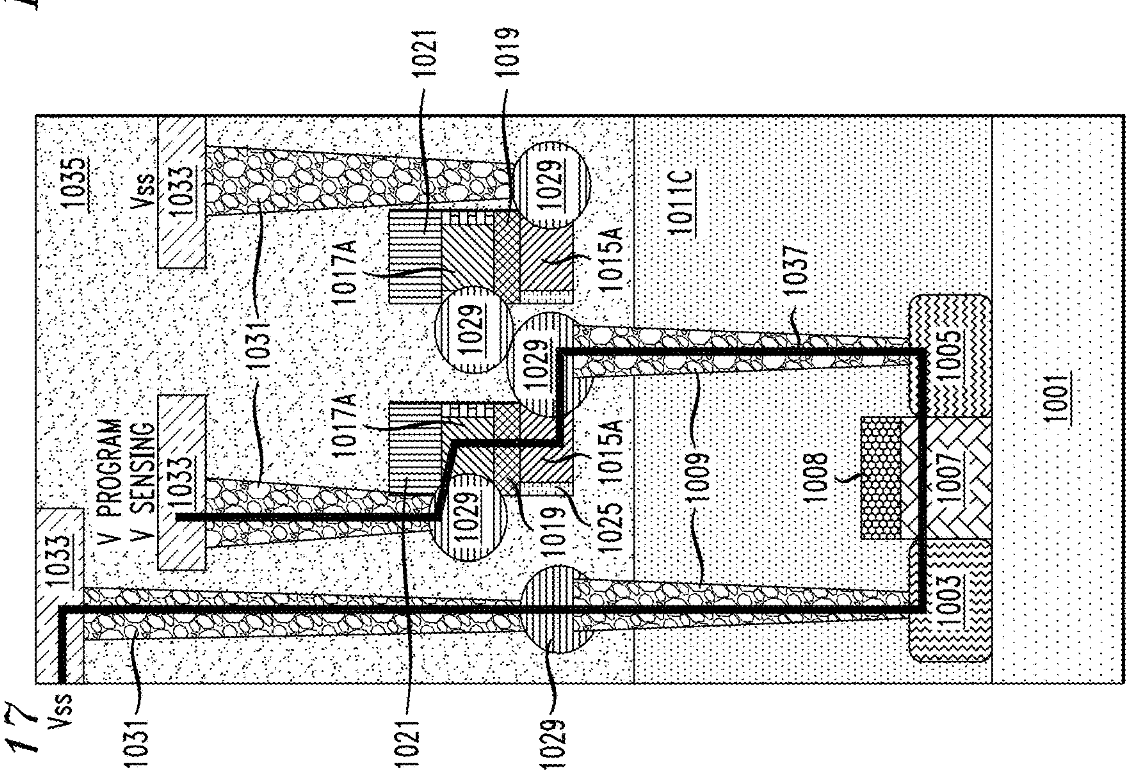

FIGS. 17 and 18 show an exemplary one transistor one resistor operation mode; FIG. 17 shows the current path 1037 of the left memory cell and FIG. 18 shows the current path 1039 of the right memory cell.

Figure 19:
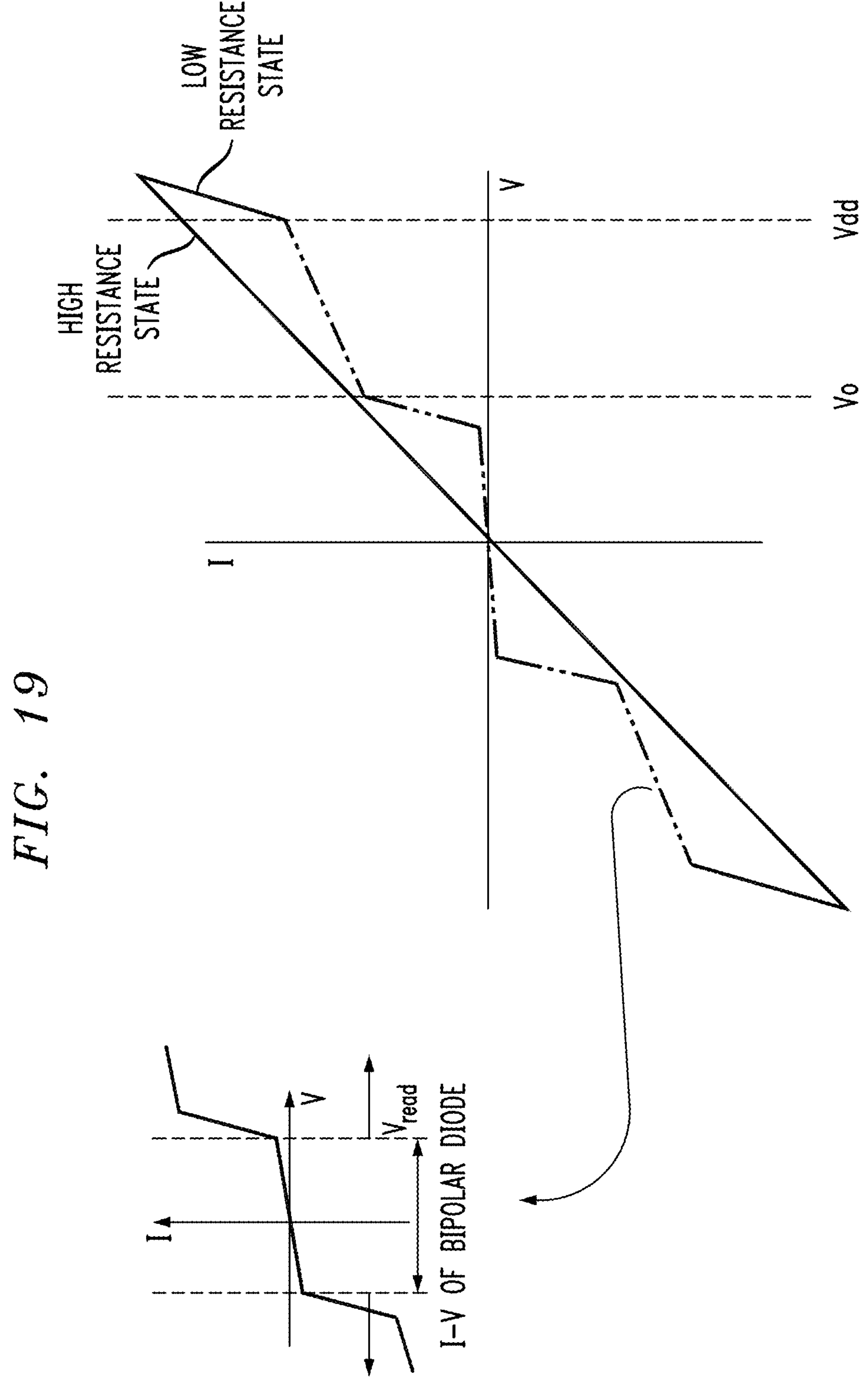
FIG. 19 shows an exemplary operation mode with bipolar diode connection or self-rectifying device, according to a further aspect of the invention.

FIG. 19 presents an operational current-voltage (I-V) curve for an operation mode with a bipolar diode connection or self-rectifying device; the inset depicts the I-V curve of a bipolar diode.

Figure 20:
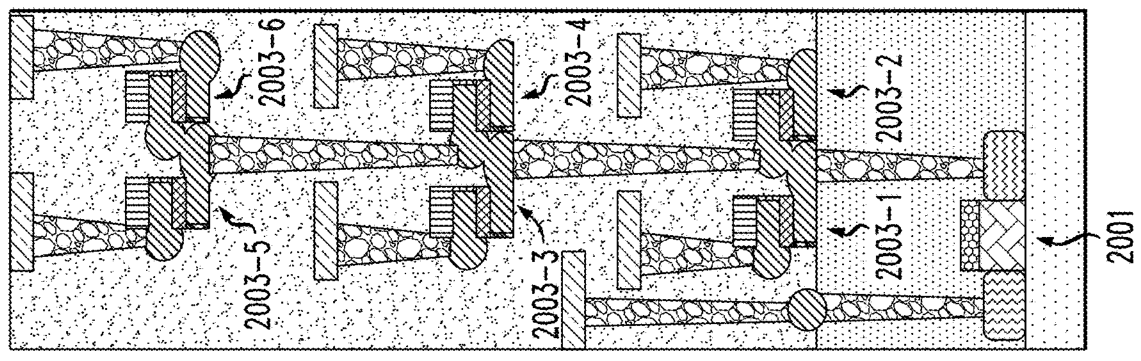
FIG. 20 shows an example one transistor six resistor configuration, according to still a further aspect of the invention.

FIG. 20 shows an alternative embodiment in the form of a one transistor-six resistor configuration with a multiple memory stack. This aspect provides the benefit that with shared vertical contacts, there is no area penalty in increasing memory cell density. Elements are otherwise generally similar to those in the previous figures. The transistor is numbered 2001 and the six resistors are numbered 2003-1, 2003-2, 2003-3, 2003-4, 2003-5, 2003-6.

Figure 21:
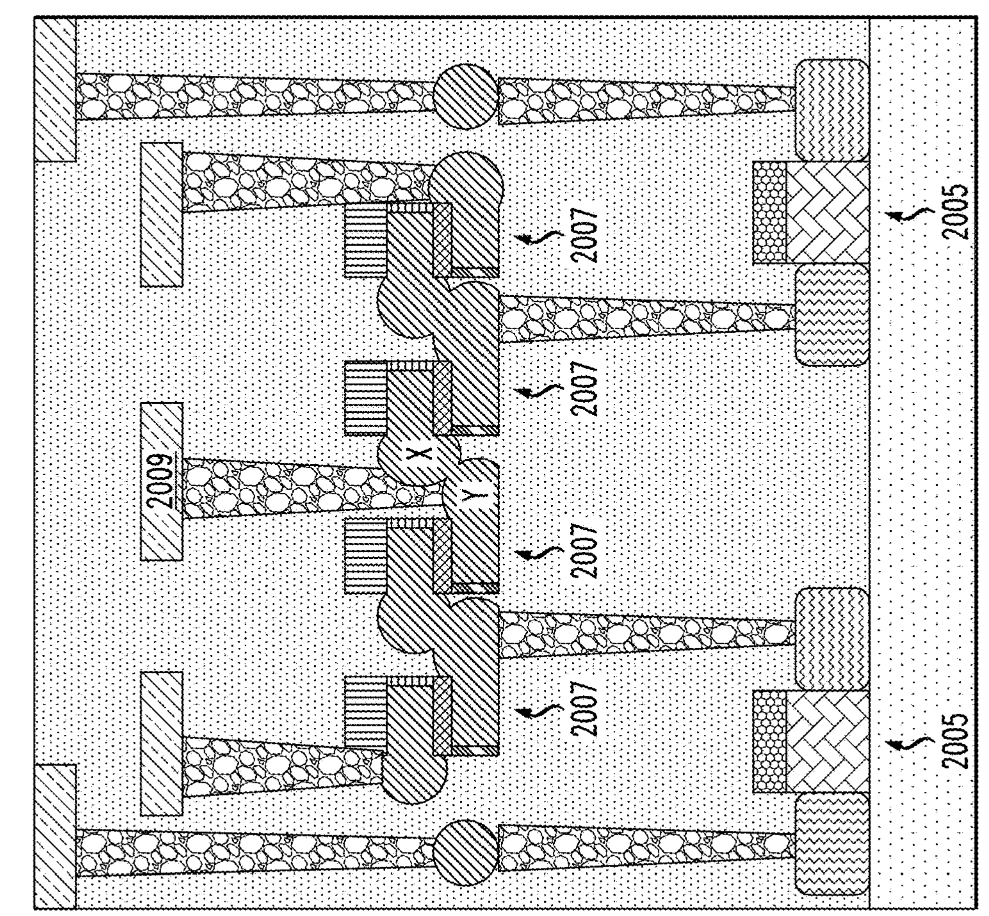
FIG. 21 shows an exemplary expansion to a two transistor-four resistor mode, according to yet a further aspect of the invention.

FIG. 21 shows another alternative embodiment expanded to a two transistor-four resistor mode (2T 4R). This aspect provides the benefit that with a shared middle contact, a total of five contacts are needed on the top, which is more scalable. Furthermore, all the top contacts can be done by a self-aligned process, which is good for scaling. Elements are otherwise generally similar to those in the previous figures. The transistors are numbered 2005 and the four resistors are numbered 2007; the shared contact is numbered 2009. Note the metal "X" that meets the metal "Y" as shown, making electrical contact.

As shown in FIG. 21, an exemplary 2T 4R embodiment has five top contacts and is 50% more scalable than a prior art 4T 4R device having eight top contacts.

Figure 22:
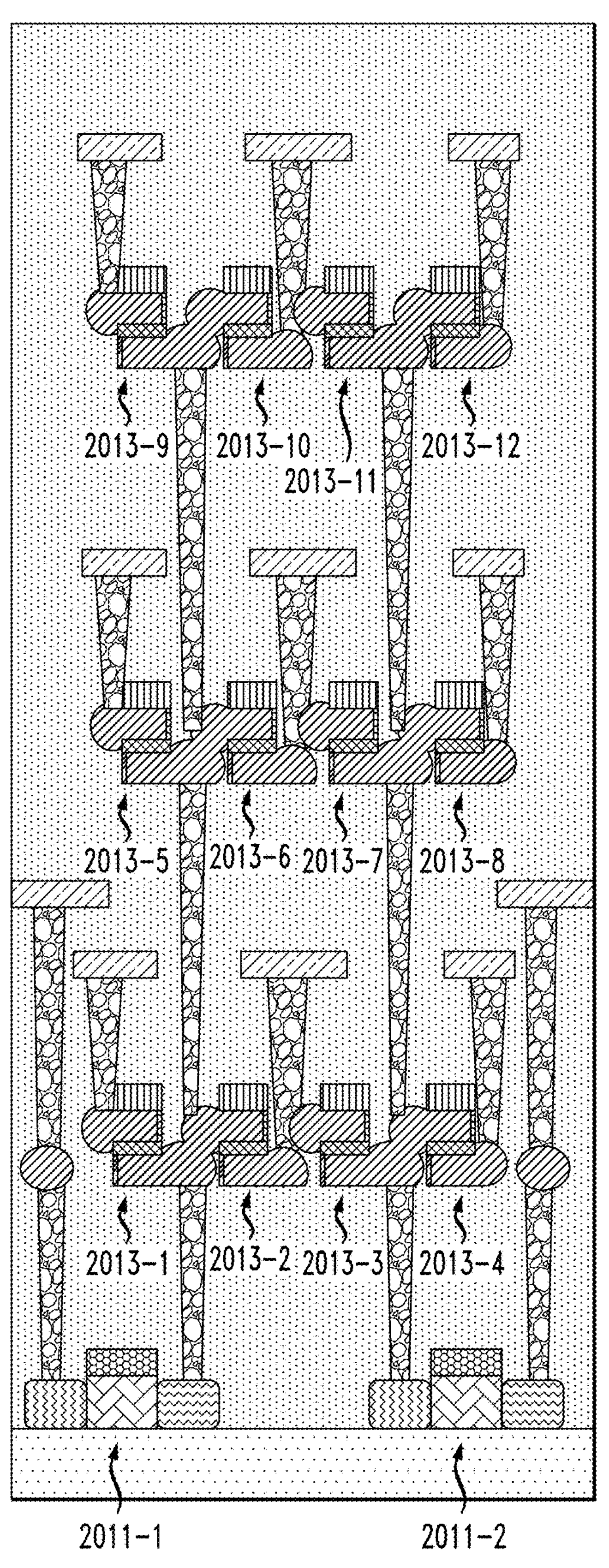
FIG. 22 shows an exemplary two transistor-twelve resistor configuration, according to yet a further aspect of the invention.

FIG. 22 shows still another alternative embodiment in the form of a 2T-12R configuration with multiple memory stack. This provides the benefit that with shared vertical contacts, there is no area penalty in increasing memory cell density. Elements are otherwise generally similar to those in the previous figures. The transistors are numbered 2011-1 and 2011-2, and the twelve resistors are numbered 2013-1, 2013-2, 2013-3, 2013-4, 2013-5, 2013-6, 2013-7, 2013-8, 2013-9, 2013-10, 2013-11, 2013-12.

An exemplary process flow thus includes conventional transistor formation; memory cell patterning; isolation; $SiO_2$ recess; angled implantation for metal oxidation; liner deposition and etch back; isotropic recess; angled RIE; angled liner deposition; metal oxidation; directional RIE to remove the metal oxide on top on source and drain contact; liner removal; selective metal deposition; and metal connection.

Furthermore, in an exemplary structure, non-volatile memory switching material (ReRAM, PCRAM, FeRAM, MRAM) is switched by top and bottom electrodes. The bottom electrode has an extended metal connection to the right and meets extended metal from the top electrode from an adjacent memory cell. The top electrode has an extended metal connection to the left and meets extended metal from the bottom electrode from an adjacent memory cell. Source and drain contacts meet extended metal from the bottom electrode. M1 contacts meet extended metal, and memory cells can be vertically stacked. As seen in the detail in FIG. 1, an exemplary memory stack includes a top electrode 1017, a bottom electrode 1015, memory switching material 1019, and a bipolar diode 2015 such as an ovonic threshold switching (OTS) device that can be inserted in the memory stack to prevent "sneak" current.

Note that the metal oxide current I-V curve can be tuned to obtain an arrangement that is self-rectifying in the bipolar direction (in this case the additional diode can be skipped).

One or more embodiments are advantageously applicable to logic analog memory applications, rather than cross bar arrays. In the exemplary unit cell with five contacts, the middle M1 contact can be shared with the memory cells on either side (one on each side total of two). A pertinent benefit of one or more embodiments is to obtain a 1T-2R unit cell to provide twice the density of the prior art.

One or more embodiments are particularly worthwhile in the case of a symmetric stack, but can also be employed in the case of an asymmetric stack by reversing the source/drain bias on the sensing transistor (such as: positive drain voltage on even order memory cells, negative drain voltage on odd order memory cells.)

Figure 1:
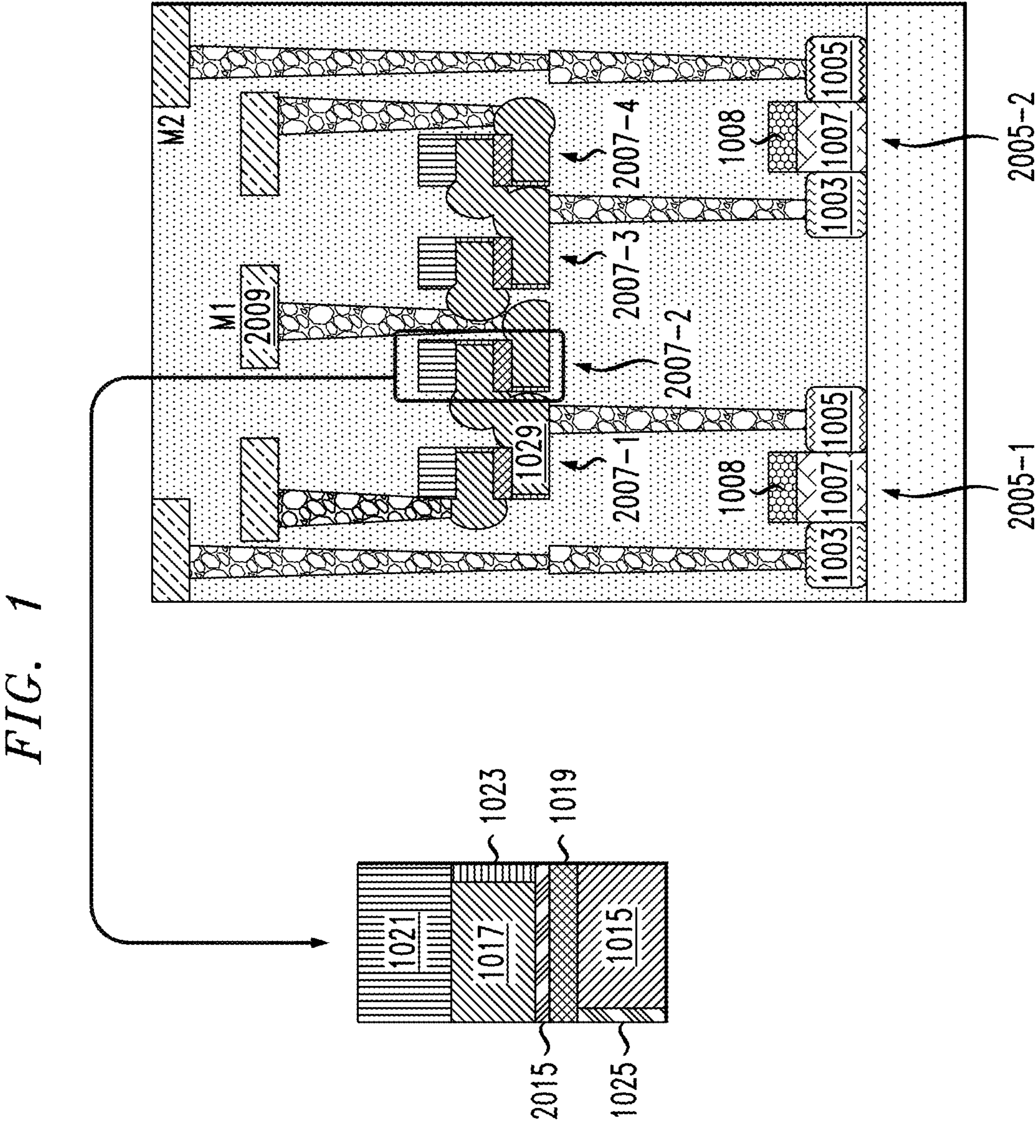
FIG. 1 shows a semiconductor structure, including details of a memory stack, according to an aspect of the invention.

FIG. 1 is similar to FIG. 21 with details of a memory stack including a bipolar diode 2015 between the top electrode 1017 and the memory switching material 1019. The transistors are numbered 2005-1 and 2005-2. The resistors are numbered 2007-1, 2007-1, 2007-3, 2007-4. It is worth noting that in one prior art 1T2R ReRAM device, the two resistors are located above the source of the transistor, so that the source needs to be enlarged to accommodate two contacts, implying no scaling benefits. In contrast, in one or more embodiments, the two resistors 2007-1, 2007-2 are located above a single contact 1029; one resistor 2007-1 is located above the gate (e.g., 1007/1008) and one resistor 2007-2 to the right side of the gate. One or more embodiments have a shared top self-aligned contact and a unique cell to cell connection. As there is no need to enlarge the contact area, there are scaling benefits, which is a pertinent aspect of one or more embodiments.

Figure 23:
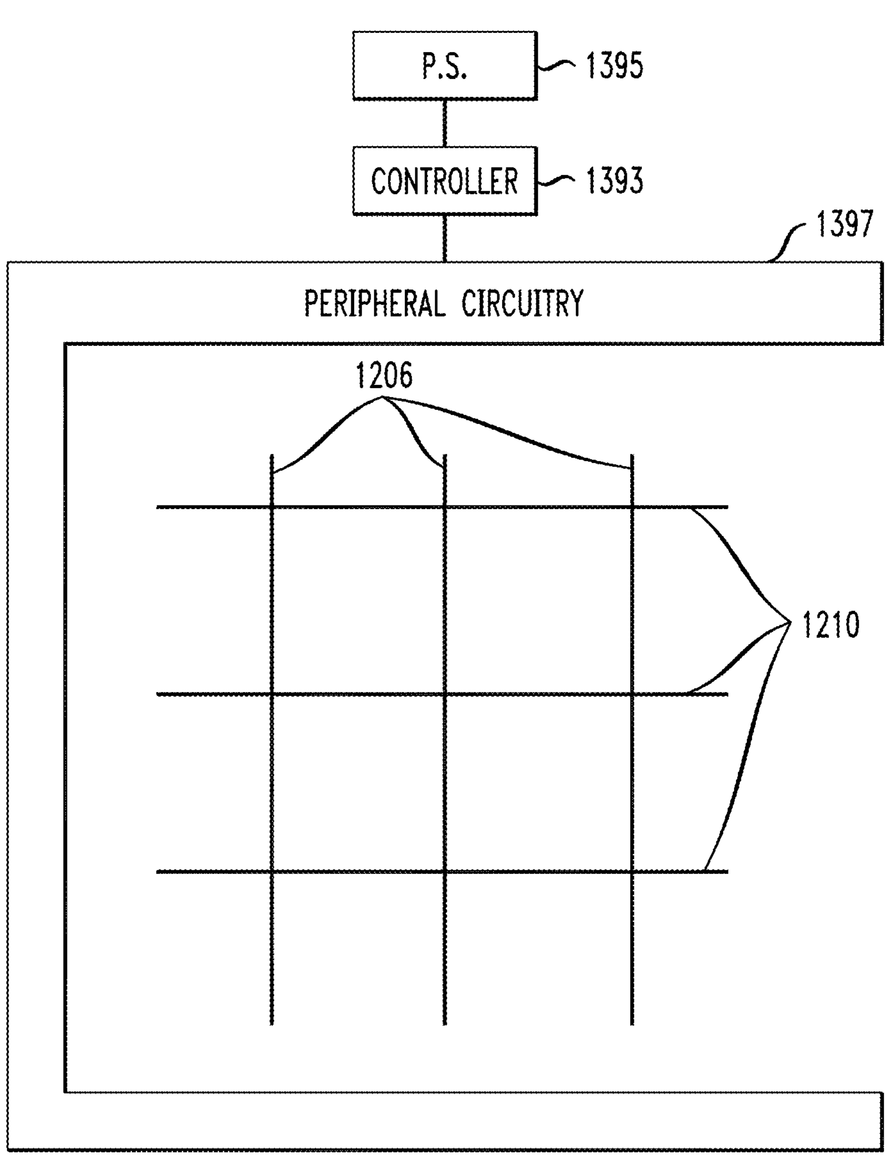
FIG. 23 shows an array of devices for a memory, according to an aspect of the invention.

FIG. 23 shows a memory array in accordance with an aspect of the invention. Note a plurality of word lines 1206 and a plurality of bit lines 1210 that interest at a plurality of cell locations. The word lines provide gate bias on the gates of the access transistors depicted in the other figures. That is to say, for the memory function (sensing and program), the gates are energized, using the word liens, to turn the transistors ON. The bit line is for readout and the bit line current corresponds to the current through the transistor channel, as shown, for example, in FIGS. 17 and 18.

Note that the access transistors can be PFETs or NFETs.

Figure 24:
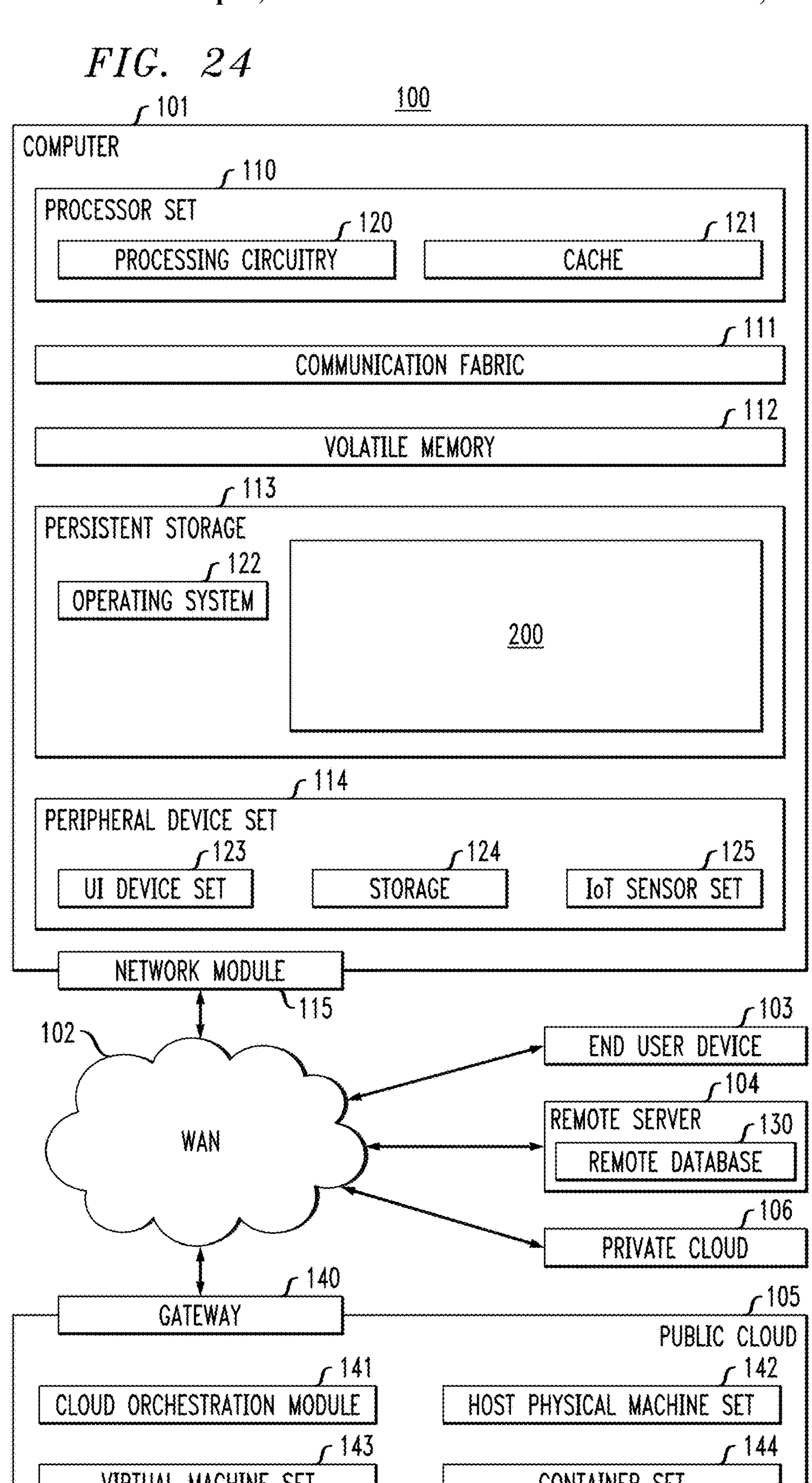
FIG. 24 depicts a computing environment according to an embodiment of the present invention (e.g., for implementing a design process such as that of FIG. 25)
Figure 25:
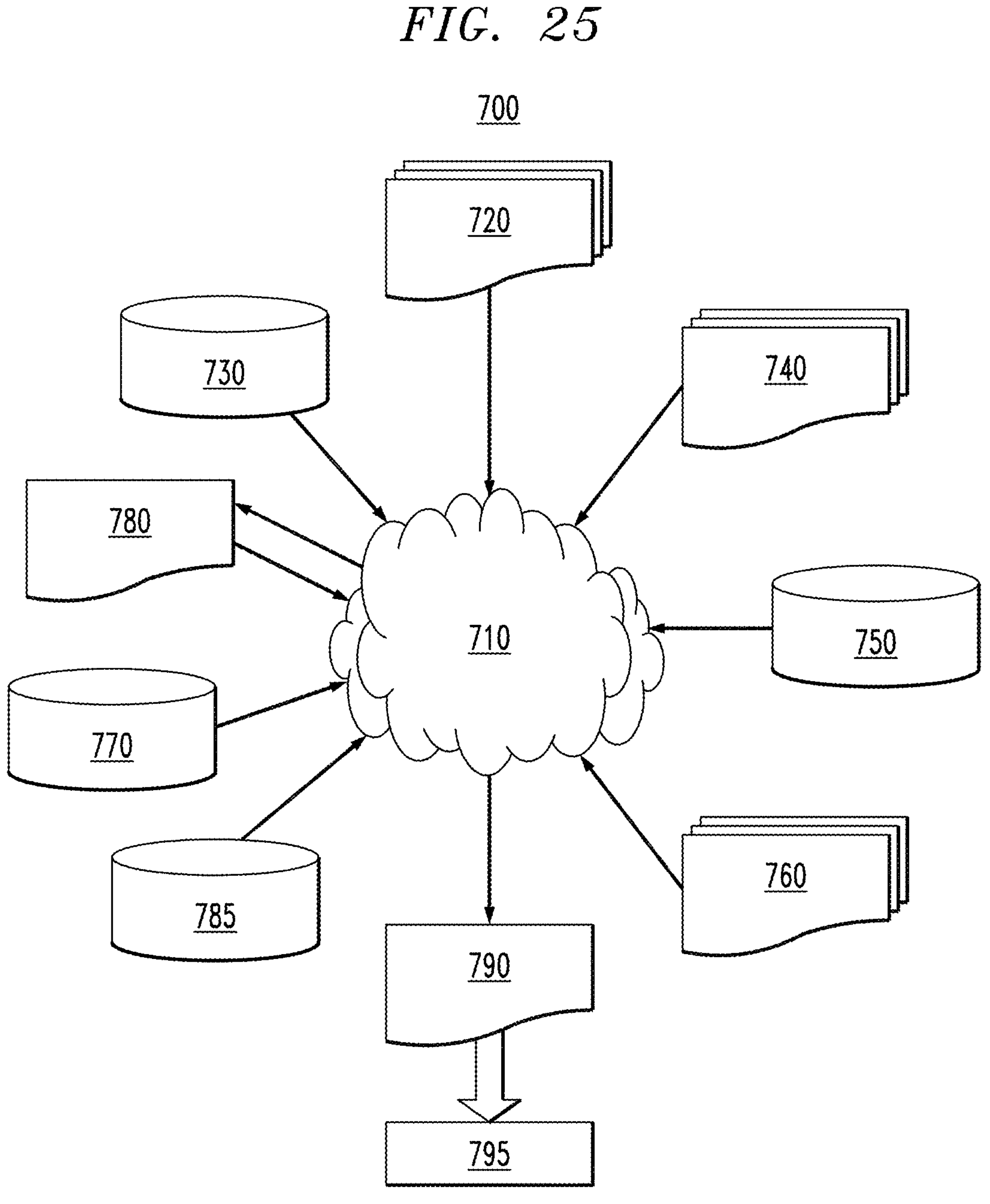
FIG. 25 is a flow diagram of a design process used in semiconductor design, manufacture, and/or test.

Note the peripheral circuitry 1397 coupled to the bit lines and word lines; a power supply 1395; and a controller 1393 coupled to the power supply and the peripheral circuitry. The power supply can be controlled by the controller to supply appropriate voltages, and can be part of the controller or a separate unit. These elements are cooperatively configured for input/output and so on. Given the teachings herein, the skilled artisan will be able to provide any additional desired/required peripheral circuitry, voltage/power supply, elements to interface with peripheral circuitry, and the controller by adapting known techniques. To implement any of the digital circuitry described herein, computer-aided semiconductor integrated circuit (IC) logic design, simulation, test, layout, and/or manufacture can be employed. The computerized design process can represent functional and/or structural design features in a design structure generated using electronic computer-aided design (ECAD). A suitable hardware-description language (HDL) can be employed. The skilled artisan can synthesize digital logic circuits to carry out desired control and other functionality, using known computer-aided design techniques such as shown in FIG. 25 implemented on a machine such as depicted in FIG. 24.

FIG. 23 depicts a high-level schematic; given the teachings herein, the skilled artisan can make appropriate connections to the bit lines and word lines and can add any additional elements as may be needed (e.g., complementary bit lines) depending on the type of resistive memory elements employed.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st *Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, and referring, for example, to FIG. 1, it will be appreciated that, in general terms, an exemplary semiconductor structure includes a selection transistor 2005-1 having a first drain-source terminal, a second drain-source terminal, at least one channel region between the first and second source-drain terminals, and a gate adjacent the at least one channel region; a first vertical contact structure connected to the first drain-source terminal (vias and metal above 1003); and a second vertical contact structure connected to the second drain-source terminal (via and metal above 1005). Also included are a first resistive memory cell 2007-1 having a lower electrode coupled to the second vertical contact structure and having an upper electrode; a third vertical contact structure connected to the upper electrode of the first resistive memory cell (via and metal above upper electrode of 2007-1); a second resistive memory cell 2007-2 having an upper electrode coupled to the second vertical contact structure and having a lower electrode; and a fourth vertical contact structure connected to the lower electrode of the second resistive memory cell (via and metal 2009 above lower electrode of 2007-2).

In one or more embodiments, the first and second resistive memory cells are selected from the group consisting of ReRAM (resistive random access memory); PCRAM (phase-change memory); FERAM (Ferroelectric RAM); and MRAM (Magnetoresistive random-access memory).

In one or more embodiments, the first and second resistive memory cells each include a memory switching material 1019 between the lower and upper electrodes 1015, 1017.

In some such embodiments, the first and second resistive memory cells each further include a bipolar diode 2015, such as an ovonic threshold switching (OTS) device.

In some cases, the first vertical contact structure comprises first and second vias extending to a metal line at an outward metal level (e.g., M2). In some such cases, the third vertical contact structure includes a via extending to a metal line at an inward metal level (e.g., M1) and a lateral portion of the upper electrode of the first resistive memory cell that extends towards the first vertical contact structure. In some such cases, the second vertical contact structure connected to the second drain-source terminal comprises a via extending to a lateral portion of the lower electrode of the first resistive memory cell that extends away from the first vertical contact structure. In some such cases, the first and second vias of the first vertical contact structure taper from wider upper ends to narrower lower ends; the via of the second vertical contact structure tapers from a wider upper end to a narrower lower end; and the via of the third vertical contact structure tapers from a wider upper end to a narrower lower end.

Recalling the exemplary discussion of 2T-4R configurations, in some cases, the selection transistor comprises a first selection transistor, and the third vertical contact structure comprises a shared contact structure, and the structure further includes a second selection transistor 2005-2 having a first drain-source terminal, a second drain-source terminal, at least one channel region between the first and second source-drain terminals, and a gate adjacent the at least one channel region; a fifth vertical contact structure connected to the first drain-source terminal (vias and metal above 1005 of 2005-2, should we reverse 1003 and 1005 for second transistor 2005-2); a sixth vertical contact structure connected to the second drain-source terminal (via and metal above 1003 of 2005-2); and a third resistive memory cell 2007-3 having a lower electrode connected to the fifth vertical contact structure and having an upper electrode coupled to the shared contact structure. The structure still further includes a fourth resistive memory cell 2007-4 having an upper electrode coupled to the lower electrode of the third resistive memory cell and having a lower electrode; and a seventh vertical contact structure coupled to the lower electrode of the further resistive memory cell (via and metal above lower electrode of 2007-4). Given the teachings herein, the skilled artisan will understand from the context and whether a transistor is n-type or p-type when a source-drain terminal is functioning as a source and when it is functioning as a drain.

Recalling discussions of vertical stacking; for example, with respect to FIGS. 20, and 22, one or more exemplary structures further include a third resistive memory cell having a lower electrode connected to the fourth vertical contact structure and having an upper electrode; a fourth resistive memory cell having an upper electrode coupled to the lower electrode of the third resistive memory cell and having a lower electrode; a fifth vertical contact structure connected to the upper electrode of the third resistive memory structure; and a sixth vertical contact structure connected to the lower electrode of the fourth resistive memory cell; where the third and fourth resistive memory cells are located above the first and second resistive memory cells. In FIG. 20, the resistive memory cells are numbered as 2003-1, 2003-2, 2003-3, and 2003-4 and in FIG. 22 as 2013-1, 2013-2, 2013-5, and 2013-6, for example.

Referring to FIG. 23, one or more embodiments further include peripheral circuitry, a voltage supply, and a controller that are cooperatively configured to selectively energize/bias the gate of the selection transistor, apply a supply voltage to at least one of the first and second drain source terminals, and cause current flow through the at least one channel region.

Still referring to FIG. 23, and also to, for example, FIG. 1, in some instances, the selection transistor, the first vertical contact structure, the second vertical contact structure; the first resistive memory cell, the third vertical contact structure, the second resistive memory cell, and the fourth vertical contact structure are repeated in an array with shared fourth vertical contact structures (e.g., 2009 with via underneath) for adjacent repetitions. The peripheral circuitry, voltage supply, and controller can be applied here as well.

In another aspect, an exemplary method of forming a semiconductor structure includes, referring to FIG. 2, providing a starting structure including: a substrate 1001, a field effect transistor, formed on the substrate, and having a source 1003 and a drain 1005 with a gate 1007 in between, a source via, and a drain via, and an inter-layer dielectric (ILD) 1011 outward of the substrate and surrounding the field effect transistor, the source via, and the drain via. Further steps include (see FIGS. 3-9) forming first and second memory cell precursors on an outer surface of the ILD, the memory cell precursors including bottom electrodes, top electrodes, memory switching material intermediate the top and bottom electrodes, and left and right side liners on the electrodes; (see FIGS. 10-13) removing only one of a left and right side liner from the top electrodes; (see FIG. 14) removing only another one of a left and right side liner from the bottom electrodes; (see FIG. 15) forming a first metal contact on the source via, a second metal contact on the top electrode of the first memory cell precursor, a third metal contact on the bottom electrode of the second memory cell precursor, and a fourth metal contact in a region interconnecting the bottom electrode of the first memory cell precursor, the top electrode of the second memory cell precursor, and the drain via; and (see FIG. 16) forming vertical metal lines on the first metal contact, the second metal contact, and the third metal contact.

In still another aspect, referring to FIGS. 17 and 18, an exemplary method of operating a semiconductor structure includes providing the semiconductor structure (which can be any of the structures described here). Further steps include applying a source voltage Vss to the source of the selection transistor; energizing the gate of the selection transistor; applying the source voltage to one of the third and fourth vertical contact structures; and applying one of a sensing and a programming voltage at another one of the third and fourth vertical contact structures. This method can be sued, for example, with ReRAM (resistive random access memory); PCRAM (phase-change memory); FERAM (Ferroelectric RAM); and/or MRAM (Magnetoresistive random-access memory).

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from use of one or more aspects of the disclosed scaled one transistor two resistor (1T 2R) memory.

An integrated circuit in accordance with aspects of the present inventions can be employed in essentially any application and/or electronic system where one or more aspects of the disclosed scaled one transistor two resistor (1T 2R) memory would be beneficial. Given the teachings of the present disclosure provided herein, one of ordinary skill in the art will be able to contemplate other implementations and applications of embodiments disclosed herein.

Reference should now be had to FIG. 24, which depicts a computing environment according to an embodiment of the present invention (e.g., for implementing a design process such as that of FIG. 25).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a system 200 for semiconductor design and/or control of semiconductor fabrication (see FIG. 25). In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 24. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 25 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 25 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A semiconductor structure comprising:

a selection transistor having a first drain-source terminal, a second drain-source terminal, at least one channel region between the first drain-source terminal and the second drain-source terminal, and a gate adjacent the at least one channel region;

a first vertical contact structure connected to the first drain-source terminal;

a second vertical contact structure connected to the second drain-source terminal, wherein the second vertical contact structure comprises a via extending to a lateral portion of a lower electrode of a first resistive memory cell that extends away from the first vertical contact structure;

the first resistive memory cell having the lower electrode coupled to the second vertical contact structure and having an upper electrode;

a third vertical contact structure connected to the upper electrode of the first resistive memory cell;

a second resistive memory cell having an upper electrode and a lower electrode, the lower electrode of the second resistive memory cell coupled to the first vertical contact structure; and a fourth vertical contact structure connected to the upper electrode of the second resistive memory cell.

2. The semiconductor structure of claim 1, wherein the first and second resistive memory cells comprise resistive random-access memory (ReRAM).

3. The semiconductor structure of claim 1, wherein the first and second resistive memory cells comprise phase-change random-access memory (PCRAM).

4. The semiconductor structure of claim 1, wherein the first and second resistive memory cells comprise ferroelectric random-access memory (FERAM).

5. The semiconductor structure of claim 1, wherein the first and second resistive memory cells comprise magnetoresistive random-access memory (MRAM).

6. The semiconductor structure of claim 1, wherein the first resistive memory cell and the second resistive memory cell each include a memory switching material between the upper and lower electrodes.

7. The semiconductor structure of claim 6, wherein the first resistive memory cell and the second resistive memory cell each further include a bipolar diode.

8. The semiconductor structure of claim 7, wherein the bipolar diodes include ovonic threshold switching (OTS) devices.

9. The semiconductor structure of claim 1, wherein the first vertical contact structure comprises a first via and a second via extending to a metal line at an outward metal level.

10. The semiconductor structure of claim 9, wherein the third vertical contact structure includes a via extending to a second metal line at an inward metal level and a lateral portion of the upper electrode of the first resistive memory cell that extends towards the first vertical contact structure.

11. The semiconductor structure of claim 10, wherein:

the first via and the second via of the first vertical contact structure taper from wider upper ends to narrower lower ends;

the via of the second vertical contact structure tapers from a wider upper end to a narrower lower end; and the via of the third vertical contact structure tapers from a wider upper end to a narrower lower end.

12. The semiconductor structure of claim 1, wherein:

the selection transistor comprises a first selection transistor;

the third vertical contact structure comprises a shared contact structure; and the semiconductor structure further comprises:

a second selection transistor having a first drain-source terminal, a second drain-source terminal, at least one channel region between the first drain-source terminal and the second drain-source terminal, and a gate adjacent the at least one channel region;

a fifth vertical contact structure connected to the first drain-source terminal;

a sixth vertical contact structure connected to the second drain-source terminal;

a third resistive memory cell having a third lower electrode connected to the fifth vertical contact structure and having a third upper electrode coupled to the shared contact structure;

a fourth resistive memory cell having a fourth lower electrode coupled to the sixth vertical contact structure and having a fourth upper electrode; and a seventh vertical contact structure coupled to the fourth upper electrode of the fourth resistive memory cell.

13. The semiconductor structure of claim 1, further comprising:

a third resistive memory cell having a third lower electrode connected to the fourth vertical contact structure and having a third upper electrode;

a fourth resistive memory cell having a fourth upper electrode coupled to the third lower electrode of the third resistive memory cell and having a fourth lower electrode;

a fifth vertical contact structure connected to the third upper electrode of the third resistive memory cell;

a sixth vertical contact structure connected to the fourth lower electrode of the fourth resistive memory cell; and wherein the third resistive memory cell and the fourth resistive memory cell are located above the first resistive memory cell and the second resistive memory cell.

14. The semiconductor structure of claim 1, further comprising peripheral circuitry, a voltage supply, and a controller that are cooperatively configured to selectively energize the gate of the selection transistor, apply a supply voltage to at least one of the first drain-source terminal and the second drain-source terminal, and cause current flow through the at least one channel region.

15. The semiconductor structure of claim 1, wherein the selection transistor, the first vertical contact structure, the second vertical contact structure, the first resistive memory cell, the third vertical contact structure, the second resistive memory cell, and the fourth vertical contact structure are repeated in an array, wherein adjacent repetitions of the array share fourth vertical contact structures.

16. The semiconductor structure of claim 15, further comprising peripheral circuitry, a voltage supply, and a controller that are cooperatively configured to selectively energize the gate of the selection transistor in one or more repetitions of the array, apply a supply voltage to at least one of the first drain-source terminal, and the second drain-source terminal in the one or more repetitions, and cause current flow through the at least one channel region in the one or more repetitions.

17. A method of forming a semiconductor structure, comprising:

providing a starting structure including:

a substrate;

a field effect transistor, formed on the substrate, and having a source and a drain with a gate in between;

a source via;

a drain via; and an inter-layer dielectric (ILD) outward of the substrate and surrounding the field effect transistor, the source via, and the drain via;

forming a first memory cell precursor and a second memory cell precursor on an outer surface of the ILD, the first memory cell precursor and the second memory cell precursor including bottom electrodes, top electrodes, memory switching material intermediate the top electrodes and the bottom electrodes, and a left side liner and a right side liner on the top electrodes and the bottom electrodes;

removing only one of the left side liner and the right side liner from the top electrodes;

removing only the other one of the left liner and the right side liner from the bottom electrodes;

forming a first metal contact on the source via, a second metal contact on the top electrode of the first memory cell precursor, a third metal contact on the bottom electrode of the second memory cell precursor, and a fourth metal contact in a region interconnecting the bottom electrode of the first memory cell precursor, the top electrode of the second memory cell precursor, and the drain via; and forming vertical metal lines on the first metal contact, the second metal contact, and the third metal contact.

18. A method of operating a semiconductor structure, comprising:

providing the semiconductor structure, the semiconductor structure comprising:

a selection transistor having a source, a drain, at least one channel region between the source and the drain, and a gate adjacent the at least one channel region;

a first vertical contact structure connected to the source;

a second vertical contact structure connected to the drain, wherein the second vertical contact structure comprises a via extending to a lateral portion of a lower electrode of a first resistive memory cell that extends away from the first vertical contact structure;

the first resistive memory cell having the lower electrode coupled to the second vertical contact structure and having an upper electrode;

a third vertical contact structure connected to the upper electrode of the first resistive memory cell;

a second resistive memory cell having an upper electrode and a lower electrode, the lower electrode of the second resistive memory cell coupled to the first vertical contact structure; and a fourth vertical contact structure connected to the upper electrode of the second resistive memory cell;

applying a source voltage to the source of the selection transistor;

energizing the gate of the selection transistor;

applying the source voltage to one of the third vertical contact structure and the fourth vertical contact structure; and applying one of a sensing voltage and a programming voltage at the other one of the third vertical contact structure and the fourth vertical contact structure.

19. The method of claim 18, wherein providing the semiconductor structure comprises selecting the first and second resistive memory cells from the group consisting of resistive random-access memory (ReRAM); phase-change random-access memory (PCRAM); ferroelectric random-access memory (FERAM); and magnetoresistive random-access memory (MRAM).

20. The method of claim 18, wherein the first resistive memory cells includes a memory switching material between the upper electrode of the first resistive memory cell and the lower electrode of the first resistive memory cell, and wherein the second resistive memory cell includes a memory switching material between the upper electrode of the second resistive memory cell and the lower electrode of the second resistive memory cell.

* * * * *